(12) United States Patent
Kobayashi

(10) Patent No.: US 10,453,608 B2
(45) Date of Patent: Oct. 22, 2019

(54) ELECTRONIC COMPONENT

(71) Applicant: Murata Manufacturing Co., Ltd., Nagaokakyo-shi, Kyoto-fu (JP)

(72) Inventor: Toshihiko Kobayashi, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/811,776

(22) Filed: Nov. 14, 2017

(65) Prior Publication Data

US 2018/0068788 A1 Mar. 8, 2018

Related U.S. Application Data

(63) Continuation of application No. PCT/JP2016/064376, filed on May 13, 2016.

(30) Foreign Application Priority Data

May 21, 2015 (JP) ................................ 2015-103610

(51) Int. Cl.
*H01G 4/30* (2006.01)
*H01G 4/232* (2006.01)
(Continued)

(52) U.S. Cl.
CPC ............. *H01G 4/008* (2013.01); *C23C 18/08* (2013.01); *C23C 18/1212* (2013.01);
(Continued)

(58) Field of Classification Search
CPC ........ H01G 4/008; H01G 4/005; H01G 4/012; H01G 4/12; H01G 4/232; H01G 4/30; (Continued)

(56) References Cited

U.S. PATENT DOCUMENTS 5,120,339 A * 6/1992 Markovich ............. C03C 25/26
65/134.4
5,672,220 A * 9/1997 Omori ...................... H01G 4/30
156/89.12
(Continued)

FOREIGN PATENT DOCUMENTS

JP H07-335471 A 12/1995
JP H09-87419 A 3/1997
(Continued)

OTHER PUBLICATIONS

International Search Report issued in International Application No. PCT/JP2016/064376, dated Jul. 19, 2016.
(Continued)

*Primary Examiner* — Dion Ferguson
(74) *Attorney, Agent, or Firm* — Arent Fox LLP

(57) ABSTRACT

A ceramic electronic component including a ceramic element assembly, an external electrode, and an underlying layer. In this ceramic electronic component, the underlying layer is formed on the ceramic element assembly, the external electrode is formed on the underlying layer, the underlying layer is formed of a metal material and a glass material containing a silicon atom, and the metal material exists in a highly dispersed state in the glass material.

7 Claims, 4 Drawing Sheets

(51) Int. Cl.
- H01G 4/008 (2006.01)
- H01G 4/12 (2006.01)
- H01F 1/01 (2006.01)
- H01G 4/005 (2006.01)
- H01G 4/012 (2006.01)
- H05K 3/38 (2006.01)
- H05K 3/46 (2006.01)
- H01F 17/00 (2006.01)
- H01F 27/29 (2006.01)
- C25D 5/10 (2006.01)
- C25D 5/54 (2006.01)
- C25D 7/00 (2006.01)
- C23C 18/08 (2006.01)
- C23C 18/12 (2006.01)
- C25D 3/12 (2006.01)
- H05K 1/03 (2006.01)
- C25D 3/38 (2006.01)

(52) U.S. Cl.
CPC ...... *C23C 18/1254* (2013.01); *C23C 18/1279* (2013.01); *C23C 18/1283* (2013.01); *C25D 5/10* (2013.01); *C25D 5/54* (2013.01); *C25D 7/00* (2013.01); *H01F 1/01* (2013.01); *H01F 17/0013* (2013.01); *H01F 27/292* (2013.01); *H01G 4/005* (2013.01); *H01G 4/012* (2013.01); *H01G 4/12* (2013.01); *H01G 4/232* (2013.01); *H01G 4/30* (2013.01); *H05K 3/38* (2013.01); *H05K 3/46* (2013.01); *C25D 3/12* (2013.01); *C25D 3/38* (2013.01); *H05K 1/0306* (2013.01); *H05K 3/4611* (2013.01)

(58) Field of Classification Search
CPC . C23C 18/08; C23C 18/1212; C23C 18/1254; C23C 18/1279; C23C 18/1283; C25D 5/10; C25D 5/54; C25D 7/00; C25D 3/12; C25D 3/38; H01F 1/01; H01F 17/0013; H01F 27/292; H05K 3/38; H05K 3/46; H05K 1/0306; H05K 3/4611
See application file for complete search history.

(56) References Cited

U.S. PATENT DOCUMENTS

| | | | |
|---|---|---|---|
| 6,344,242 B1* | 2/2002 | Stolk | B01J 13/0026 106/1.11 |
| 8,767,375 B2 | 7/2014 | Park et al. | |
| 9,328,014 B2 | 5/2016 | Nishisaka et al. | |
| 10,014,110 B2* | 7/2018 | Nishisaka | H01G 4/2325 |
| 10,121,595 B2* | 11/2018 | Hamamori | H01G 4/005 |
| 10,134,533 B2* | 11/2018 | Kimura | H01G 4/30 |
| 10,186,378 B2* | 1/2019 | Hamanaka | H01G 2/06 |
| 2013/0050896 A1 | 2/2013 | Park et al. | |
| 2014/0292142 A1* | 10/2014 | Nishisaka | C03C 8/18 310/311 |
| 2015/0213953 A1* | 7/2015 | Jun | H01G 4/2325 361/301.4 |
| 2016/0237571 A1* | 8/2016 | Liu | C03C 17/36 |

FOREIGN PATENT DOCUMENTS

| | | |
|---|---|---|
| JP | 2004-079211 A | 3/2004 |
| JP | 2004-327983 A | 11/2004 |
| JP | 2013-048231 A | 3/2013 |
| JP | 2014-053551 A | 3/2014 |
| JP | 2014-096406 A | 5/2014 |
| JP | 2014-209550 A | 11/2014 |
| JP | 2016-160453 A | 9/2016 |

OTHER PUBLICATIONS

Written Opinion of the International Searching Authority issued in International Application No. PCT/JP2016/064376, dated Jul. 19, 2016.

* cited by examiner

ELECTRONIC COMPONENT

CROSS REFERENCE TO RELATED APPLICATIONS

The present application is a continuation of International application No. PCT/JP2016/064376, filed May 13, 2016, which claims priority to Japanese Patent Application No. 2015-103610, filed May 21, 2015, the entire contents of each of which are incorporated herein by reference.

FIELD OF THE INVENTION

The present invention relates to an electronic component, in particular, a ceramic electronic component having an external electrode and a method of manufacturing the ceramic electronic component.

BACKGROUND OF THE INVENTION

In general, an electronic component is provided with an external electrode to be connected with other circuit elements. Due to recent demands for miniaturization of components, it is also required that this external electrode be as thin as possible. However, in the prior art, the external electrode is formed by applying a conductive paste on a ceramic element assembly and baking the conductive paste, and the thickness of the external electrode thus obtained is large and, in addition, often non-uniform. In response to such a problem, Patent Document 1 discloses that a thin and uniform external electrode can be formed by using a method of forming an external electrode by plating, instead of a conventional method of baking a conductive paste to form an external electrode.

Patent Document 1: Japanese Patent Application Laid-Open No. 2004-327983

SUMMARY OF THE INVENTION

However, as in Patent Document 1, the external electrode formed directly on the ceramic element assembly by plating is chemically bonded only to an internal electrode (or lead electrode) of the ceramic element assembly and not chemically bonded to the ceramic element assembly. Accordingly, close-contact properties between the external electrode and the ceramic element assembly are low. As a result, there may occur a problem that the external electrode may peel, or moisture may intrude from between the external electrode and the ceramic element assembly to lower reliability of a ceramic electronic component.

In addition, particularly when the ceramic element assembly is a multilayer ceramic component, there may occur a problem that a plating solution intrudes into a multilayer structure when plating is applied directly to the ceramic element assembly, thereby lowering the reliability.

Accordingly, an object of the present invention is to provide a ceramic electronic component having high close-contact properties to a ceramic element assembly and including a thin and uniform external electrode and a method of manufacturing such a ceramic electronic component.

As a result of intensive studies on the above problems, the inventors of the present invention have found out that an underlying layer in which a metal material exists in a highly dispersed state in a glass material containing a silicon atom is formed on a ceramic element assembly, and an external electrode is formed on the underlying layer by plating, whereby a thin, uniform, highly sealable, and highly close-contact external electrode can be formed.

That is, the present invention provides a ceramic electronic component including a ceramic element assembly, an external electrode, and an underlying layer. In the ceramic electronic component, the underlying layer is formed on the ceramic element assembly, the external electrode is formed on the underlying layer, the underlying layer is formed of a metal material and a glass material containing a silicon atom, and the metal material exists in a highly dispersed state in the glass material.

Preferably, the metal material contains at least one of copper and silver.

In addition, it is preferred that the metal material is granular in the underlying layer, and an average grain size of the metal material is not less than 2.0 nm and not more than 1.0 μm.

More preferably, in the ceramic electronic component, a metal atom and a silicon atom coexist in a region of the underlying layer located at the center in a thickness direction of the underlying layer in a cross section in the thickness direction and having a depth of not less than 0.2 μm and not more than 2 μm from a surface of the cross section and a diameter of not less than 0.2 μm and not more than 2 μm.

The ratio of the content of the metal atom to the content of the silicon atom in the region is preferably not less than 1.0 and not more than 200 in mass ratio.

In another preferred configuration of the ceramic electronic component, the metal material is granular in the underlying layer, and an average inter-grain distance of the metal material is not less than 1 nm and not more than 1 μm.

In yet another preferred configuration of the ceramic electronic component, the metal material is granular in the underlying layer, the average grain size of the metal material is not less than 2.0 nm and not more than 1.0 μm, and the average inter-grain distance of the metal material is not less than 1 nm and not more than 1 μm.

In addition, the thickness of the underlying layer is preferably not more than 10.0 μm.

Preferably, the underlying layer is obtained by applying a sol in which a silicon compound, a metal salt, and one of boric acid and boron alkoxide are dissolved or dispersed in a solvent and then applying heat treatment to the sol. The heat treatment is also preferably performed under a reducing atmosphere.

A method of manufacturing a ceramic electronic component according to an embodiment of the present invention includes preparing a ceramic element assembly; providing a sol containing a silicon compound, a metal salt, and one of boric acid and boron alkoxide; supplying the sol to a surface of the ceramic element assembly and forming a sol film on the surface of the ceramic element assembly; and applying heat treatment to the obtained film to obtain an underlying layer.

The method further preferably includes forming an external electrode on the underlying layer by plating.

In the method of manufacturing a ceramic electronic component, the silicon compound is preferably at least one of tetramethoxysilane, tetraethoxysilane, and tetra-isopropoxysilane; the metal salt is one of a metal carboxylate salt and a metal nitrate salt; and the metal salt contains at least one of a copper salt and a silver salt.

A sol according to an aspect of the present invention contains a silicon compound, a metal salt, and one of boric acid and boron alkoxide, and is used in the method of manufacturing the ceramic electronic component noted above.

According to aspects of the present invention, since the underlying layer contains the glass material, the underlying layer can be firmly in close contact with the ceramic element assembly, and, in addition, since the underlying layer contains the metal material, the underlying layer can be firmly in close contact with the external electrode. Since the glass material of the underlying layer is mainly composed of $SiO_2$, the glass material has high sealing properties, so that when the external electrode is formed by plating, it is possible to suppress intrusion of a plating solution into the ceramic element assembly, and the glass material further has high moisture resistance.

DETAILED DESCRIPTION OF PREFERRED EMBODIMENTS OF THE INVENTION

A ceramic electronic component and a method of manufacturing the ceramic electronic component according to the present invention will be described in detail below with reference to the drawings. However, the configuration, shape, arrangement and the like of the ceramic electronic component of the present invention are not limited to the illustrated examples.

Figure 1:
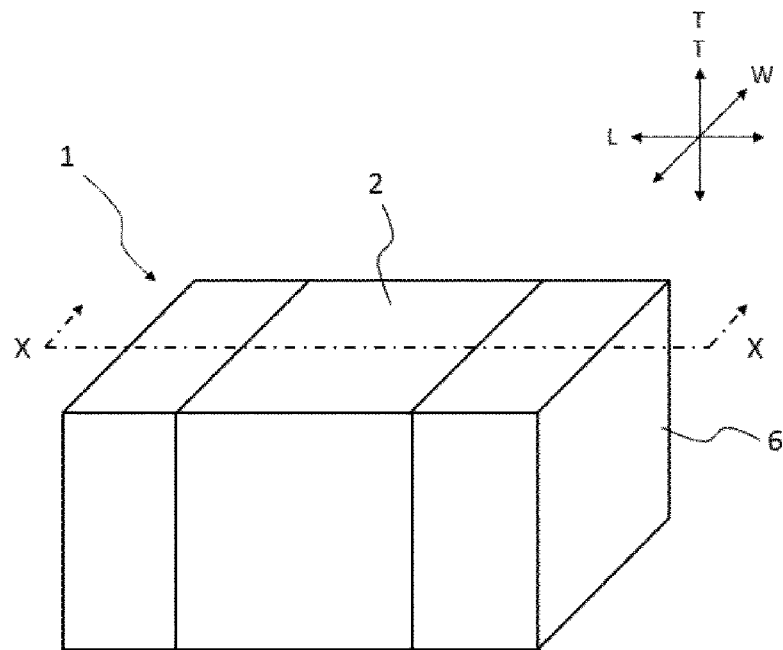
FIG. 1 is a schematic perspective view of a ceramic electronic component according to an embodiment of the present invention.
Figure 2:
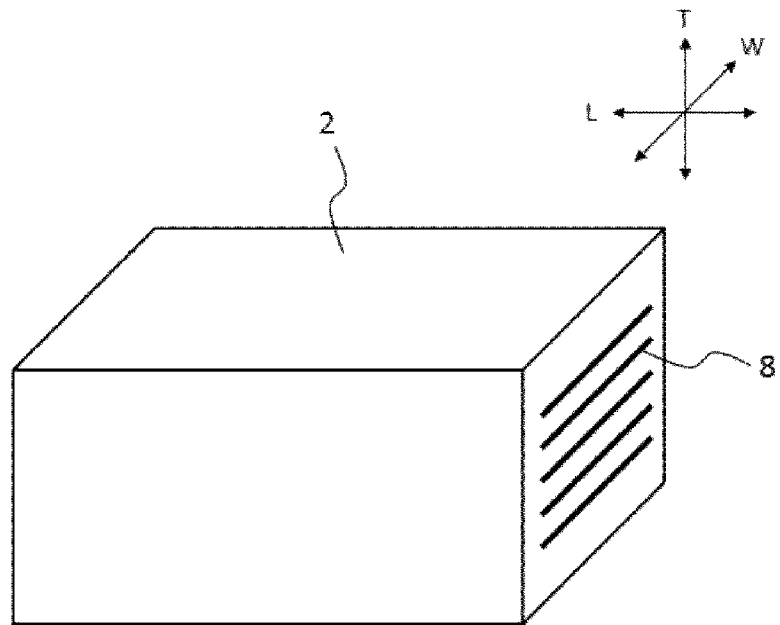
FIG. 2 is a schematic perspective view of a ceramic element assembly of the ceramic electronic component of FIG. 1.
Figure 3:
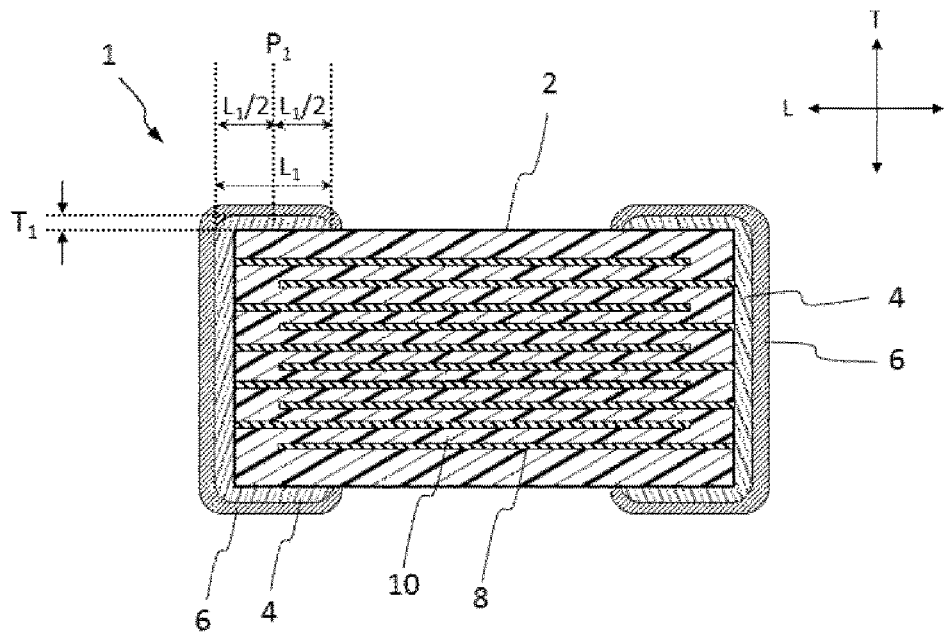
FIG. 3 is a schematic cross-sectional view taken along line x-x of the ceramic electronic component of FIG. 1.

As shown in FIGS. 1 to 3, the ceramic electronic component 1 of the present embodiment is a multilayer capacitor. The ceramic electronic component 1 roughly includes a ceramic element assembly 2, an underlying layer 4, and an external electrode 6.

As shown in FIG. 3, the ceramic element assembly 2 in the present embodiment is a laminate of laminar internal electrodes 8 and ceramic layers 10. In the ceramic element assembly 2, the plurality of internal electrodes 8 are stacked with the respective ceramic layers 10 interposed therebetween, and are alternately exposed from end surfaces opposed to each other of the ceramic element assembly 2 (that is, the left and right surfaces in FIG. 3).

The underlying layer 4 is provided so as to cover both end surfaces of the ceramic element assembly 2 (that is, the left and right surfaces in FIG. 3), and is electrically connected to the internal electrode 8 exposed from the end surface. The external electrode 6 is provided so as to be stacked on the underlying layer 4, and is electrically connected to the internal electrode 8 with the underlying layer 4 interposed therebetween.

The ceramic electronic component 1 as described above can be manufactured as follows.

First, the ceramic element assembly 2 is prepared.

For example, the ceramic element assembly 2 is formed by applying a conductor paste for forming the internal electrode 8 on a sheet of the ceramic layer 10, a plurality of sheets thus obtained is stacked to provide a structure as shown in FIG. 3, and the laminate is fired, whereby the ceramic element assembly 2 can be obtained. The method of manufacturing the ceramic element assembly 2 is not limited to the above, and the ceramic element assembly 2 may be manufactured by another method depending on the type, configuration, size, etc. of the ceramic electronic component.

The material constituting the internal electrode 8 in the ceramic element assembly 2 is not particularly limited as long as it is conductive, and examples thereof include Ag, Cu, Pt, Ni, Al, Pd, and Au. The material constituting the internal electrode 8 is preferably Ag, Cu, and Ni.

The material constituting the ceramic layer 10 in the ceramic element assembly 2 is not particularly limited as long as it is a ceramic material used for electronic components.

In the present embodiment, since the ceramic electronic component 1 is a multilayer capacitor, the ceramic layer 10 is a dielectric material. Examples of the material constituting the ceramic layer 10 include $BaTiO_3$, $CaTiO_3$, $SrTiO_3$, $CaZrO_3$, $(BaSr)TiO_3$, $Ba(ZrTi)O_3$, and $(BiZn)Nb_2O_7$. The ceramic material used in the present invention is not limited to the above-described materials, and can be appropriately selected depending on the type, configuration, and the like of the electronic component. For example, when the ceramic electronic component is a ferrite coil component, the ceramic material may be a ferrite material including Fe, Ni, Zn, Mn, Cu and the like. In this case, the ceramic element assembly may be provided with a coil instead of the internal electrode.

An end portion of the coil is exposed from the end surface of the ceramic element assembly and electrically connected to the external electrode with the underlying layer interposed therebetween.

Then, the underlying layer 4 is formed on both end surfaces of the ceramic element assembly 2 (that is, the left and right surfaces in FIG. 3).

First, a sol in which a silicon compound, a metal salt, and one of boric acid and boron alkoxide are dissolved or dispersed in a solvent is provided.

As the silicon compound, silicon alkoxide is preferable. The silicon alkoxide is not particularly limited, and examples thereof include tetramethoxysilane, tetraethoxysilane, tetra-iso-propoxysilane, tetra-n-propoxysilane, tetra-n-butoxysilane, tetra-sec-butoxysilane, tetra-tert-butoxysilane, tetrapentaethoxysilane, tetrapenta-iso-propoxysilane, tetrapenta-n-propoxysilane, tetrapenta-n-butoxysilane, tetrapenta-sec-butoxysilane, and tetrapenta-tert-butoxysilane. The silicon compound may be silica sol, colloidal silica, silicic acid, alkali metal silicate such as sodium silicate, or nano silica.

The content of the silicon compound in the sol may be not less than 0.1% by mass and not more than 20.0% by mass, preferably not less than 0.1% by mass and not more than 10.0% by mass, more preferably not less than 0.2% by mass and not more than 6% by mass, for example not less than 1.0% by mass and not more than 10.0% by mass, or not less than 2.0% by mass and not more than 8.0% by mass based on the entire sol. Within such a range, the metal material is more highly dispersed during gelation.

Examples of the metal salt include a nitrate salt and a carboxylate salt, and the nitrate salt is preferably used.

Although the metal in the metal salt is not particularly limited as long as it is a conductive metal, copper and silver are preferable. Such a metal is precipitated in the glass material by heat treatment of the sol as described below to form a conductive path in the underlying layer. The metal in the metal salt may be both copper and silver. That is, the metal salt may contain both a copper salt and a silver salt. In this case, the underlying layer contains both copper and silver.

In a preferred embodiment, the metal salt can be copper nitrate or silver nitrate.

Both copper nitrate and silver nitrate may be used as the metal salt. In this case, the underlying layer contains both copper and silver.

The metal salt may be solvated, for example hydrated.

The content of the metal salt in the sol may be not less than 5.0% by mass and not more than 50.0% by mass, preferably not less than 10.0% by mass and not more than 40.0% by mass, more preferably not less than 7.0% by mass and not more than 40.0% by mass, still more preferably not less than 14.0% by mass and not more than 30.0% by mass, even more preferably not less than 9.0% by mass and not more than 30.0% by mass based on the entire sol. Within such a range, the metal material is more highly dispersed in the underlying layer after gelation, and a good conductive path can be formed.

In one embodiment, the ratio of the content of the silicon compound to the content of the metal salt may be in the range of 1:170 to 4:1, preferably in the range of 1:170 to 1:1.5, for example in the range of 1:50 to 4:1, in the range of 1:40 to 1:1, or in the range of 1:15 to 1:1.5.

The content of boric acid or boron alkoxide in the sol may be not less than 0.05% by mass and not more than 5.0% by mass, preferably not less than 0.1% by mass and not more than 5.0% by mass, more preferably not less than 0.1% by mass and not more than 4.0% by mass, for example, not less than 0.1% by mass and not more than 3.0% by mass based on the entire sol. Preferably, the sol contains boric acid.

Although the solvent is not particularly limited as long as the silicon compound and the metal salt are well soluble or dispersible, alcohols, ethers, glycols, or glycol ethers is preferable. In a preferred embodiment, the solvent may be methanol, ethanol, 1-propanol, 2-propanol, 1-butanol, 2-butanol, iso-butyl alcohol, 1-pentanol, 2-pentanol, 2-methyl-2-pentanol, 2-methoxyethanol, 2-ethoxyethanol, 2-butoxyethanol, ethylene glycol, diethylene glycol, triethylene glycol, propylene glycol, dipropylene glycol monomethyl ether, diethylene glycol monomethyl ether, diethylene glycol monoethyl ether, diethylene glycol monobutyl ether, triethylene glycol monomethyl ether, or diethylene glycol monohexyl ether.

As required, the sol may contain a pH adjusting agent and various additives (e.g., a stabilizer and a thickener) for improving the strength of the glass material formed from the silicon compound in the sol and close-contact properties to the ceramic element assembly.

Then, the sol is provided to both end surfaces of the ceramic element assembly 2 from which the internal electrode is exposed to form a sol film.

The method of providing (or applying) the sol is not particularly limited, and immersion, spraying, screen printing, brushing, ink jet printing, or the like can be used.

Then, the sol film formed as described above is heat-treated and cured to obtain the underlying layer 4. For example, the sol film is subjected to a first heat treatment to be dried, and thus to form a film of gel. Then, the gel film is subjected to a second heat treatment to be fired, and thus to form an underlying layer (hereinafter also referred to as a sol-gel fired film). The first heat treatment and the second heat treatment may be performed consecutively. In other words, the heat treatment may include the first heat treatment and the second heat treatment. In this case, the sol film can be formed as an underlying layer by a single heat treatment.

The heating temperature in the heat treatment is preferably not less than 100° C. and not more than 900° C., more preferably not less than 110° C. and not more than 850° C., for example, not less than 120° C. and not more than 800° C.

The heating time in the heat treatment is preferably not less than 5 minutes and not more than 500 minutes, more preferably not less than 10 minutes and not more than 400 minutes, for example, not less than 20 minutes and not more than 300 minutes.

The heating temperature in the first heat treatment is preferably not less than 100° C. and not more than 200° C., more preferably not less than 110° C. and not more than 180° C., for example, not less than 120° C. and not more than 160° C.

The heating time in the first heat treatment is preferably not less than 5 minutes and not more than 60 minutes, more preferably not less than 10 minutes and not more than 50 minutes, for example, not less than 20 minutes and not more than 40 minutes.

The heating temperature in the second heat treatment is preferably not less than 450° C. and not more than 900° C., more preferably not less than 500° C. and not more than 850° C., for example, not less than 550° C. and not more than 800° C.

The heating time in the second heat treatment is preferably not less than 10 minutes and not more than 500 minutes, more preferably not less than 20 minutes and not more than 400 minutes, for example, not less than 30 minutes and not more than 300 minutes.

In a preferred embodiment, the heat treatment is performed under a reducing atmosphere. Although the metal material derived from the metal salt is precipitated in the glass material by the heat treatment, oxidation of this metal material can be suppressed by performing the heat treatment under the reducing atmosphere. By performing the heat treatment under the reducing atmosphere in this way, oxidation of the metal material is suppressed, and electrical resistance can be reduced. Consequently, the resistance of the entire underlying layer 4 can be reduced.

The reducing atmosphere means an atmosphere in which oxygen partial pressure is equal to or lower than M-$MO_x$ equilibrium oxygen partial pressure of a metal M of a metal material at a temperature during treatment. The reducing atmosphere may be not only a reducing gas atmosphere such as $H_2$ or CO, but also an inert gas (e.g., a rare gas such as argon or nitrogen) atmosphere.

By virtue of the above-described heat treatment, the silicon compound in the sol undergoes a dehydration condensation reaction to become $SiO_x$ (typically $SiO_2$) in a glass state, thus forming a glass material. The metal salt precipitates as a metal (that is, a metal material) in the glass material by the above-described heat treatment. That is, the underlying layer has features of a layer formed by a sol-gel method. In a sol-gel reaction, a glass material and a metal material are produced through a state where a metal salt which is a precursor of a metal material is dispersed at a molecular level in a sol containing a silicon compound which is a precursor of a glass material. Thus, the metal material can be highly dispersed in the glass material.

Accordingly, in the underlying layer 4 obtained above, the metal material exists in a highly dispersed state in the glass material.

In a preferred embodiment, the metal material is dispersed in a granular form in the glass material.

Some grains are exposed from the underlying layer. It is not necessary that all grains of the metal material exist independently, and some grains may be in contact with adjacent grains. The grains in contact with each other form a conductive path in the underlying layer 4 and confer conductivity to the underlying layer.

An average grain size of the granular metal material is preferably not less than 2.0 nm and not more than 1.0 μm, more preferably not less than 2.5 nm and not more than 800 nm, further preferably not less than 3.0 nm and not more than 600 nm.

In one embodiment, when the metal material is copper, the average grain size is preferably not less than 2.0 nm and not more than 1.0 μm, more preferably not less than 2.5 nm and not more than 600 nm, further preferably not less than 2.5 nm and not more than 500 nm.

In one embodiment, when the metal material is silver, the average grain size is preferably not less than 2.0 nm and not more than 1.0 μm, more preferably not less than 2.5 nm and not more than 800 nm, further preferably not less than 2.5 nm and not more than 700 nm.

The average grain size can be obtained, for example, by acquiring a cross-sectional image of the underlying layer with a scanning transmission electron microscope (TEM), measuring the grain sizes of 50 arbitrary particles in a 2.0 μm diameter spot in the glass material, and calculating the average value. The grains exposed on a surface of the glass material are excluded from the grain size measurement.

In the underlying layer 4, an average inter-grain distance of the metal material is preferably not less than 1 nm and not more than 1 μm, more preferably not less than 5 nm and not more than 500 nm, further preferably not less than 5 nm and not more than 200 nm.

The average inter-grain distance can be obtained, for example, by acquiring a cross-sectional image of the underlying layer with a scanning transmission electron microscope (TEM), measuring distances between grains at 50 arbitrary points in a 2.0 μm diameter spot in the glass material, and calculating the average value. The grains exposed on the surface of the glass material are excluded from the measurement of the inter-grain distance.

In a preferred embodiment, the metal material in the underlying layer 4 is granular, the average grain size is not less than 2.0 nm and not more than 1.0 μm, more preferably not less than 2.5 nm and not more than 800 nm, further preferably not less than 3.0 nm and not more than 600 nm, and the inter-grain distance is not less than 1 nm and not more than 1 μm, more preferably not less than 5 nm and not more than 500 nm, further preferably not less than 5 nm and not more than 200 nm. That is, the metal material is highly dispersed in the glass material. In other words, the description that "the metal material exists in a highly dispersed state in the glass material" means that in the underlying layer 4, a granular metal material having an average grain size of not less than 2.0 nm and not more than 1.0 μm is dispersed in the glass material. The average inter-grain distance of the metal material at this time is preferably not less than 1 nm and not more than 1 μm. The glass material is formed from a sol containing a silicon compound (e.g., silicon alkoxide).

In a preferred embodiment, a metal atom and a silicon atom coexist in a region of the underlying layer located at the center in a thickness direction of the underlying layer in a cross section in the thickness direction and having a depth of not less than 0.2 μm and not more than 2 μm from a surface of the cross section and a diameter of not less than 0.2 μm and not more than 2 μm. The region may be a region having a diameter of not less than 1 μm and not more than 2 μm and a depth of not less than 1 μm and not more than 2 μm from the surface of the cross section. For example, the region may be a cylindrical region having a depth of 0.2 μm and a diameter of 0.2 μm. Alternatively, the region may be a cylindrical region having a depth of 1.0 μm and a diameter of 1.0 μm.

Since the metal material is highly dispersed in the glass material in the underlying layer of the present invention, the metal atom and the silicon atom may coexist in substantially all regions so long as the regions are located at the center in the thickness direction of the cross section of the underlying layer. For example, when 50 μm of the cross section of the underlying layer is cut out in a direction parallel to a surface of the ceramic element assembly and divided into 25 units, in the region located at the center in the thickness direction of the cross section of the underlying layer, the unit in which both the metal atom and the silicon atom exist may be not less than 23 units, preferably not less than 24 units, more preferably 25 units.

In a preferred embodiment, in the region of the underlying layer located at the center in the thickness direction of the cross section of the underlying layer and having a diameter of not less than 0.2 μm and not more than 2 μm and a depth of not less than 0.2 μm and not more than 2 μm, the ratio (M/Si ratio) of the content of the metal atom (M) to the content of the silicon atom (Si) is in the range of not less than 1.0 and not more than 200, preferably not less than 2.0 and not more than 150.0, more preferably not less than 3.0 and not more than 100.0 in mass ratio.

In the underlying layer 4, the content of the metal material is preferably not less than 1% by volume and not more than 95% by volume, more preferably not less than 5% by volume and not more than 70% by volume, further preferably not less than 5% by volume and not more than 60% by volume. When the content of the metal material is not less than 5% by volume, the conductivity of the underlying layer can be secured more reliably. Further, when the content of the metal material is not more than 70% by volume, the underlying layer can contain a sufficient amount of the glass material to have better sealing properties and close-contact properties to the ceramic element assembly.

The underlying layer can be thinned because a solvent and byproducts are removed during the heat treatment of the sol film which is a precursor film. The thickness of the underlying layer is preferably not less than 50 nm and not more than 10 μm, more preferably not less than 100 nm and not more than 5 μm, for example not less than 200 nm and not more than 2 μm. When the thickness of the underlying layer is not less than 50 nm, the sealing properties of the underlying layer can be enhanced. On the other hand, when the thickness of the underlying layer is not more than 5 μm, it is advantageous from the viewpoint of miniaturization of the ceramic electronic component.

The underlying layer becomes a dense glassy $SiO_x$ layer by the sol-gel method. Thus, the underlying layer has high sealing properties, and it is possible to suppress intrusion of substances from the outside into the ceramic element assembly. Specifically, it is possible to suppress intrusion of a plating solution into the ceramic element assembly during plating treatment and intrusion of moisture (water vapor)

into the ceramic element assembly. That is, the underlying layer has high plating solution resistance and moisture resistance.

Since the underlying layer contains the glass material, the underlying layer can be chemically bonded to the ceramic element assembly and consequently can be firmly in close contact with the ceramic element assembly. The close-contact properties can be further strengthened by the heat treatment.

Since the metal material is highly dispersed in the glass material in the underlying layer and is exposed from the surface of the underlying layer, the underlying layer is excellent in plating properties.

Then, the external electrode 6 is formed on the underlying layer 4 obtained above.

The external electrode 6 is preferably formed by plating. By forming the external electrode by plating, a thinner and more uniform external electrode can be formed.

As described above, since plating is formed on the metal material exposed on the surface of the underlying layer 4 firmly in close contact with the ceramic element assembly, the plating layer can be firmly in close contact with the ceramic element assembly with the underlying layer interposed therebetween.

The material constituting the external electrode 6 is not particularly limited as long as it is conductive, and examples thereof include Ni, Cu, Ag, Sn, and Au.

Although the plating treatment may be one of an electrolytic plating treatment and an electroles plating treatment, the electrolytic plating treatment is preferable since the metal material is exposed on the surface of the underlying layer. The conditions of the plating treatment can be appropriately selected depending on the type of metal to be plated, the metal material in the underlying layer, thickness of a plating film, and the like.

In one embodiment, the plating treatment may be performed in multiple stages. In the case of performing the multi-stage plating treatment as described above, the external electrode is constituted of a plurality of layers. The plurality of layers may be formed of the same metal or different metals.

The thickness of the external electrode is preferably not less than 100 nm and not more than 5 μm, more preferably not less than 150 nm and not more than 3 μm, for example not less than 500 nm and not more than 2 μm.

In the present invention, since the external electrode can be formed by plating, thinning of the electrode is less likely to occur also at a corner portion of a ceramic element, and a difference between the thickness at the corner portion and the thickness at a flat portion (e.g., a central portion of an end surface of the ceramic element) can be reduced.

The thickness at a corner portion of the external electrode can be substantially equal to the thickness of the external electrode, and is preferably not less than 2 nm and not more than 5 μm, more preferably not less than 50 nm and not more than 3 μm, for example, not less than 100 nm and not more than 2 μm.

Although one embodiment of the present invention has been described above, the present invention is not limited to this embodiment, and various modifications are possible.

For example, although the above-described ceramic electronic component is a multilayer capacitor, the ceramic electronic component may be another electronic component having an external electrode, for example, a coil component, a resistor, or a transistor.

Although the ceramic electronic component and the ceramic element in the above embodiment have a shape as shown in FIGS. 1 to 3, the shape is not limited to this, and for example, the corners may be rounded, or it is possible to adopt another shape, for example, a plate shape or a cylindrical shape.

EXAMPLES

Example 1

Formation of Underlying Layer

A ceramic element assembly (1.0 mm×0.5 mm×0.5 mm) for a multilayer capacitor having a structure in which internal electrodes were alternately exposed from both end surfaces as shown in FIGS. 2 and 3 was prepared. This ceramic element assembly includes an internal electrode formed of Ni and a ceramic layer formed of $BaTiO_3$. One end surface (left and right surfaces in FIG. 2, that is, surfaces from which the internal electrodes are exposed) of the ceramic element assembly and a portion of a side surface (a portion of front and rear surfaces and upper and lower surfaces in FIG. 2) following the end surface were immersed in a 2-methoxyethanol solution (sol) containing 3.2% by mass of tetraethoxysilane, 0.55% by mass of boric acid, and 18.6% by mass of silver nitrate, thus forming a sol film. The sol film was subjected to a heat treatment at 150° C. for 30 minutes to be dried, and thus to form a gel film. The other end surface was treated in the same way.

Subsequently, a heat treatment was performed at 650° C. for 60 minutes under a nitrogen atmosphere, thus obtaining an underlying layer (hereinafter also referred to as a sol-gel fired film) in which in glass mainly composed of $SiO_2$, silver nitrate was thermally decomposed to disperse Ag grains precipitated as metals.

Formation of External Electrode

Copper plating was applied to the underlying layer using the following conditions to form an external electrode (Cu plating), and thus to obtain a sample (ceramic capacitor).

(Plating Conditions)

Plating bath type: Pyrophosphate Cu plating bath (pH=8.6)

Bath temperature: 45° C.

Current value: 10 A

Plating time: 90 minutes

Thickness Measurement

Figure 4:
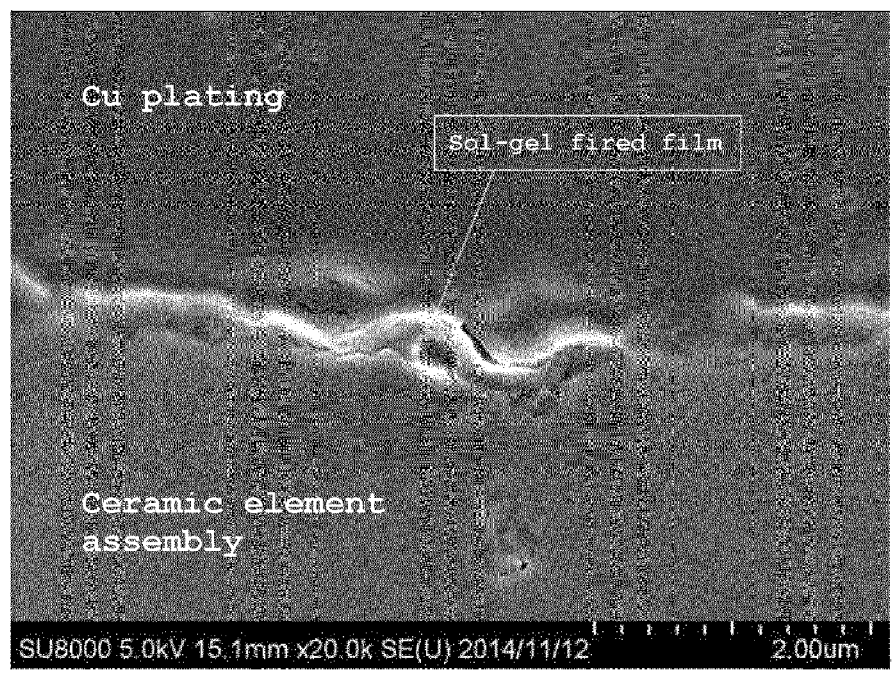
FIG. 4 is an SEM image of a cross section of a sample of Example 1.

An LT surface (a surface parallel to the paper surface of FIG. 1) of the sample was polished until the width of the sample (the length in the W direction in FIG. 1) was halved. For the sol-gel fired film (corresponding to a fired film formed on the left side of the upper surface of FIG. 3) provided on one side surface of the sample after polishing, the thickness $T_1$ of the sol-gel fired film at the center $P_1$ (that is, $P_1$ bisects the length $L_1$ of the sol-gel fired film along the L direction in FIG. 3) of the length of the sol-gel fired film along the length direction L of the sample was measured using an image obtained by an FE-SEM (manufactured by Hitachi High-Technologies Corporation: SU 8010). The observation magnification at this time was 20000 times, and the acceleration voltage was 5 kV. Consequently, it was confirmed that a sol-gel fired film having a thickness of 0.2 μm was formed (FIG. 4).

Dispersibility Evaluation

Figure 5:
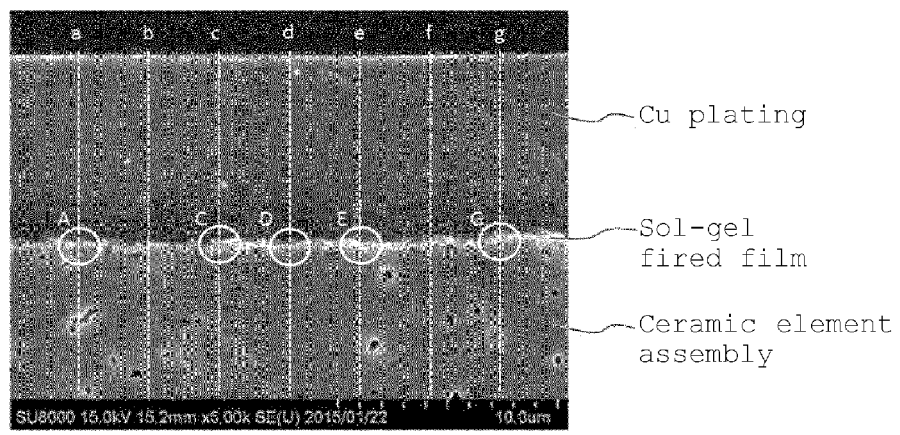
FIG. 5 is an SEM image of a cross section of the sample of Example 1, and is a view for explaining measurement points for dispersibility evaluation.

The vicinity of $P_1$ of the sol-gel fired film was observed with a scanning electron microscope (SEM). The observation magnification was 5000 times, and the acceleration voltage was 15 kV. In this field of view, a portion corresponding to half of the thickness of the sol-gel fired film formed on the ceramic element assembly was subjected to point analysis using EDX (manufactured by Horiba Seisakusho Co., Ltd.: EMAX Evolution). In the point analysis, as shown in FIG. 5, the field of view was horizontally equally divided into eight areas by line segments a to g, and the point analysis was subjected to positions A, C, D, E, and G where the line segments a, c, d, e, and g intersected with the sol-gel fired film. The data collection time at this time was 300 sec. Consequently, it was confirmed that an Ag atom and a Si atom coexisted in all regions of the sol-gel fired film subjected to the point analysis.

The analysis results for the five points A, C, D, E and G are shown in the table below.

TABLE 1

| Measurement point | Ag/Si ratio (mass %/mass %) |
|---|---|
| A | 44.4 |
| C | 115.4 |
| D | 3.0 |
| E | 6.3 |
| G | 41.9 |

Using the software Casino (Monte Carlo Simulation of Electron Trajectory in Solids) predicting a trajectory of electrons in a solid by a Monte Carlo simulation, a spread of an electron beam was calculated when the analysis target was $SiO_2$ and the acceleration voltage was 15 kV. As a result of the simulation, the spread of the electron beam was horizontally 1 μm in the width direction and 2 μm in the depth direction. When the analysis target contains $SiO_2$ and silver, it is predicted that the spread of the electron beam will be further reduced as compared to the above result. That is, the region to be subjected to the point analysis of the sol-gel fired film by SEM/EDX (15 kV) is the same as or narrower than a region of 2 μm in diameter and 2 μm in depth.

From the above results, since Ag and Si were detected from all measurement points (a region of not more than 2 μm in diameter and not more than 2 μm in depth), it was confirmed that Ag grains existed in a highly dispersed state in a glass containing $SiO_2$.

Close-Contact Properties Evaluation

In the same manner as described above, 20 samples each formed with an underlying layer and an external electrode were prepared and adhered to a land of a glass epoxy resin substrate using a conductive adhesive. Then, an adhesive tape (manufactured by Sekisui Chemical Co., Ltd.: Cellotape No. 252) was adhered onto a surface opposite the adhesive surface and pulled with a constant force along the length direction L of the sample (180° peel test). Thereafter, it was confirmed using a light microscope whether a plating layer was peeled. As a result, there was no sample whose plating layer was peeled. From the above results, it was confirmed that the plating layer was firmly in close contact with an element.

Sealing Property Evaluation

In the same manner as described above, 20 samples each formed with an underlying layer and an external electrode were prepared, vacuum-impregnated with a fluorescent liquid (manufactured by Henkel Japan Ltd.: Resinol 90C), and then dried at 120° C. for 15 minutes. Then, whether the fluorescent liquid infiltrated at a plating layer on the underlying layer in a cross section parallel to the LT surfaces of those samples and a ceramic element assembly interface was confirmed using a fluorescence microscope (manufactured by Carl Zeiss, Inc.: AXIO Imager Mim). As a result, no infiltration of the fluorescent liquid between the underlying layer and the ceramic element assembly was confirmed for all the samples. From the above results, it was confirmed that the underlying layer had high sealing properties.

Average Grain Size and Average Inter-Grain Distance of Granular Metal Material Dispersed in Glass Material In the sample of Example 1, the average grain size of the metal material (that is, Ag grains) was 75 nm. The average inter-grain distance of the metal material was 50 nm. Although a portion of the metal material was exposed from the surface of the underlying layer, the exposed metal material was excluded from the measurement.

Example 2

Formation of Underlying Layer

A ceramic element assembly (1.0 mm×0.5 mm×0.5 mm) for a multilayer capacitor having a structure in which internal electrodes were alternately exposed from both end surfaces as shown in FIGS. 2 and 3 was prepared. This ceramic element assembly includes an internal electrode formed of Ni and a ceramic layer formed of $BaTiO_3$. One end surface of the ceramic element assembly and a portion of a side surface following the end surface were immersed in a 2-methoxyethanol solution (sol) containing 5.9% by mass of tetraethoxysilane, 1.0% by mass of boric acid, and 14.3% by mass of copper (II) nitrate trihydrate, thus forming a sol film. The sol film was subjected to heat treatment at 150° C. for 30 minutes to be dried, and thus to form a gel film. The other end surface was treated in the same way.

Subsequently, a heat treatment was performed at 750° C. for 60 minutes under a nitrogen-hydrogen atmosphere, thus obtaining an underlying layer (sol-gel fired film) in which in glass mainly composed of $SiO_2$, copper nitrate was thermally decomposed and reduced to disperse Cu grains precipitated as metals.

Formation of External Electrode

Copper plating was applied to the underlying layer using the same conditions as Example 1 to form an external electrode, and thus to obtain a sample (ceramic capacitor).

Thickness Measurement

Figure 6:
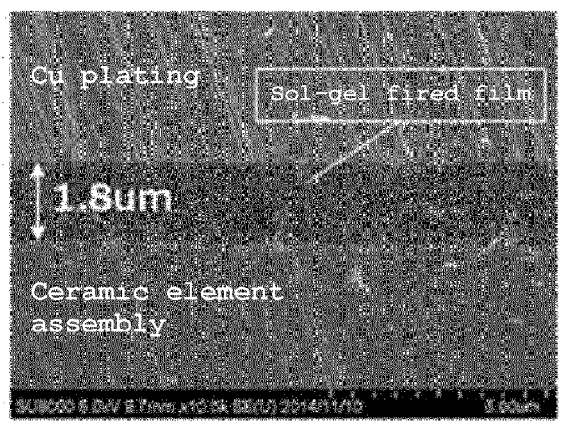
FIG. 6 is an SEM image of a cross section of a sample of Example 2.

The thickness was measured in the same manner as in Example 1 except that the observation magnification was 10000 times. The thickness of the sol-gel fired film of the sample of Example 2 was 1.8 μm (FIG. 6).

Dispersibility Evaluation

Since there was a possibility that copper atoms derived from plating might be detected, after the formation of the underlying layer, the sample before plating treatment was subjected to dispersibility evaluation. As in Example 1, measurement points were determined and analyzed.

TABLE 2

| Measurement point | Cu/Si ratio (mass %/mass %) |
|---|---|
| A | 4.1 |
| C | 4.2 |
| D | 3.7 |
| E | 4.2 |
| G | 4.0 |

As in the case of silver, when the analysis target contains $SiO_2$ and copper, it is predicted that the spread of the electron beam will be further reduced as compared to the case of only $SiO_2$. That is, the point analysis of the sol-gel fired film by SEM/EDX (15 kV) is the same as or narrower than a region of 2 μm in diameter and 2 μm in depth. From the above results, since Cu and Si were detected from all measurement points (a region of not more than 2 μm in diameter and not more than 2 μm in depth), it was confirmed that Cu grains were highly dispersed in a glass containing $SiO_2$.

Close-contact Properties Evaluation

As in Example 1, the close-contact properties were evaluated on 20 samples. As a result, there was no sample whose plating layer was peeled. From the above results, it was confirmed that the plating layer was firmly in close contact with an element.

Sealing Property Evaluation

As in Example 1, the sealing properties were evaluated on 20 samples. As a result, no infiltration of the fluorescent liquid between the underlying layer and the ceramic element assembly was confirmed. From the above results, it was confirmed that the underlying layer had high sealing properties.

Average Grain Size and Average Inter-Grain Distance of Granular Metal Material Dispersed in Glass Material In the sample of Example 2, the average grain size of the metal material (that is, Cu grains) was 20 nm. The average inter-grain distance of the metal material was 10 nm.

From the results of Example 2, it was confirmed that by performing sol-gel firing in a reducing atmosphere and forming an underlying layer, even copper easily oxidized could be precipitated in the underlying layer. That is, it was confirmed that the metal material in the underlying layer of the present invention was not limited to noble metal, and base metal might be used.

Comparative Example 1

A ceramic element assembly (1.0 mm×0.5 mm×0.5 mm) for a multilayer capacitor having a structure in which internal electrodes were alternately exposed from both end surfaces as shown in FIGS. 2 and 3 was prepared. This ceramic element assembly includes an internal electrode formed of Ni and a ceramic layer formed of $BaTiO_3$. Plating treatment was applied to the ceramic element assembly without forming an underlying layer. The obtained plating layer was 6 μm. The plating conditions are shown below.

(Plating Conditions)

Plating bath type: Pyrophosphate Cu plating bath (pH=8.6)

Bath temperature: 45° C.

Current value: 6 A

Plating time: 240 minutes

Close-contact Properties Evaluation

As in Example 1, the close-contact properties were evaluated on 20 samples. As a result, it was confirmed that the plating layer was peeled for all 20 samples.

Sealing Property Evaluation

As in Example 1, the sealing properties were evaluated on 20 samples. As a result, infiltration of a fluorescent liquid was observed in all 20 samples.

Comparative Example 2

The underlying layer was formed using a glass paste containing a Cu powder having an average particle size of 3 μm and a glass powder having an average particle size of 1 μm instead of a sol. The ratio of the Cu powder and the glass powder in the glass paste is 1:1 by volume ratio. Specifically, a ceramic element assembly (1.0 mm×0.5 mm×0.5 mm) for a multilayer capacitor having a structure in which internal electrodes were alternately exposed from both end surfaces as shown in FIGS. 2 and 3 was prepared. This ceramic element assembly includes an internal electrode formed of Ni and a ceramic layer formed of $BaTiO_3$. A glass paste having the following composition was applied to one end surface of the ceramic element assembly and dried at 120° C. for 30 minutes to form a glass paste film. The other end surface was treated in the same way. Then, heat treatment was performed at 680° C. under a nitrogen atmosphere to fire the glass paste film.

Subsequently, as in Example 1, the fired glass paste film was subjected to copper plating treatment. However, copper plating could not be formed on the entire surface of the glass paste film after firing. In particular, it was confirmed that copper plating did not adhere to a corner portion of an element where the thickness tended to be reduced.

Thickness Measurement

As in Example 1, the thickness of a fired glass paste film was measured. The thickness of the fired glass paste film was 2.0 μm.

Average Grain Size and Average Inter-Grain Distance of Granular Metal Material

In the sample of Comparative Example 2, in a Cu powder used as a raw material, particles were connected to each other by firing, so that the average grain size and the average inter-grain distance could not be measured.

Comparative Example 3

A sample was obtained in the same manner as in Comparative Example 2 except that a glass paste was applied such that the thickness of a glass paste film after firing was 14.0 μm to form the glass paste film. The thickness was measured in the same manner as in Example 1 except that the observation magnification was 5000 times.

Dispersibility Evaluation

Figure 7:
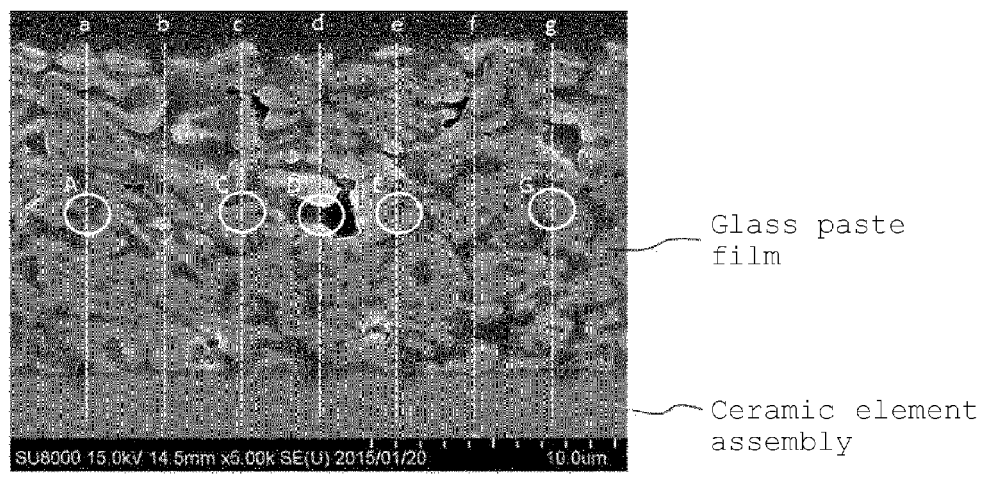
FIG. 7 is an SEM image of a cross section of a sample of Comparative Example 3, and is a view for explaining measurement points for dispersibility evaluation.

Since there was a possibility that copper atoms derived from plating might be detected, after firing of the glass paste film, the sample before plating treatment was subjected to dispersibility evaluation. As in Example 1, measurement points were determined and analyzed (FIG. 7).

TABLE 3

| Measurement point | Cu/Si ratio (mass %/mass %) |
| --- | --- |
| A | 5.9 |
| C | 20.9 |
| D | 22.6 |
| E | 102.6 |
| G | Si undetected |

From the above results, it was confirmed that Si was not detected in (3), and a glass containing Cu grains and $SiO_2$ was not highly dispersed.

Close-contact Properties Evaluation

As in Example 1, the close-contact properties were evaluated on 20 samples. As a result, there was no sample whose plating layer was peeled.

Sealing Property Evaluation

As in Example 1, the sealing properties were evaluated on 20 samples. As a result, no infiltration of a fluorescent liquid was observed.

Average Grain Size and Average Inter-Grain Distance of Granular Metal Material

In the sample of Comparative Example 2, in the Cu powder used as a raw material, particles were connected to each other by heat treatment, so that the average grain size and the average inter-grain distance could not be measured. (see FIG. 7).

Example 3

Formation of Underlying Layer

A ceramic element assembly (0.6 mm×0.3 mm×0.3 mm) for a multilayer capacitor having a structure in which internal electrodes were alternately exposed from both end surfaces as shown in FIGS. 2 and 3 was prepared. This ceramic element assembly includes an internal electrode formed of Ni and a ceramic layer formed of $BaTiO_3$. One end surface (left and right surfaces in FIG. 2, that is, surfaces from which the internal electrodes are exposed) of the ceramic element assembly and a portion of a side surface (a portion of front and rear surfaces and upper and lower surfaces in FIG. 2) following the end surface were immersed in a diethylene glycol monoethyl ether solution (sol) containing copper (II) nitrate trihydrate and nanosilica in such an amount that the ratio between copper and glass as shown in Table 4 below was established and further containing boric acid, thus forming a sol film. The sol film was subjected to a heat treatment at 150° C. for 30 minutes to be dried, and thus to form a gel film. The other end surface was treated in the same way.

Subsequently, a heat treatment was performed at 750° C. for 60 minutes under a nitrogen-hydrogen atmosphere, thus obtaining an underlying layer (hereinafter also referred to as the sol-gel fired film) in which glass mainly composed of $SiO_2$, copper nitrate was thermally decomposed and reduced to disperse Cu grains precipitated as metals. Consequently, chips each having an underlying layer and corresponding to samples 1 to 11 shown in Table 4 below were obtained.

Formation of External Electrode

Copper plating, nickel plating and tin plating were sequentially applied to the underlying layer using the following conditions to form an external electrode (Cu-nickel-tin plating), and thus to obtain samples 1 to 11 (ceramic capacitors).

(Copper Plating Conditions)
Plating bath type: Pyrophosphate Cu plating bath (pH=8.6)
Bath temperature: 45° C.
Current value: 10 A
Plating time: 90 minutes
(Nickel Plating Conditions)
Plating bath type: Watt bath (pH=4.0)
Bath temperature: 40° C.
Current value: 6 A
Plating time: 51 minutes
(Tin Plating Conditions)
Plating bath type: Neutral plating bath (pH=6.0)
Bath temperature: 30° C.
Current value: 3 A
Plating time: 66 minutes
Dispersibility Evaluation Since there was a possibility that copper atoms derived from plating might be detected, after the formation of the underlying layer, the samples 1 to 11 before plating treatment were subjected to dispersibility evaluation. As in Example 1, measurement points were determined and analyzed. The results are shown in Table 4 below.

Comparative Example 4

A sample 12 was obtained in the same manner as in Comparative Example 2 except that a ceramic element assembly having dimensions of 0.6 mm×0.3 mm×0.3 mm was used, and a sample subjected to copper plating treatment was further subjected to the nickel plating and the tin plating in Example 3. As a result of conducting the moisture resistance reliability evaluation described below on the obtained sample 12, 16 out of 17 samples were judged to be defective.

Moisture Resistance Reliability Evaluation

The moisture resistance was investigated by PCBT (pressure cooker bias test).

Specifically, 17 samples of each of the samples 1 to 11 obtained above were subjected to a test for 72 hours under conditions of 125° C., relative humidity of 95% RH, and voltage of 3.2 V, and insulation resistance was measured. A sample whose insulation resistance value was reduced by one digit or more was judged to be defective. The measurement results are shown in Table 5 below.

Plating Evaluation 20 samples after plating were observed with a stereomicroscope to evaluate whether plating was deposited on all sites where the underlying layer was formed. The results are shown in Table 5.

TABLE 4

| | Volume ratio | | Cu/Si ratio | | | | |
|---|---|---|---|---|---|---|---|
| Sample | Cu | Glass | A | C | D | E | G |
| 1 | 5 | 95 | 1.3 | 1.1 | 1.6 | 1.4 | 1.3 |
| 2 | 10 | 90 | 3.4 | 2.8 | 3.9 | 5.3 | 7.0 |
| 3 | 15 | 85 | 6.8 | 8.6 | 10.4 | 5.8 | 12.6 |
| 4 | 30 | 70 | 11.2 | 9.2 | 19.4 | 18.7 | 9.6 |
| 5 | 40 | 60 | 12.2 | 43.0 | 15.4 | 14.7 | 12.6 |
| 6 | 51 | 49 | 21.6 | 20.8 | 19.6 | 18.4 | 28.7 |
| 7 | 60 | 40 | 26.1 | 15.9 | 19.0 | 62.2 | 28.4 |
| 8 | 70 | 30 | 29.4 | 101.7 | 34.8 | 62.3 | 62.5 |
| 9 | 85 | 15 | Si undetected | 132.3 | 125.7 | 112.2 | 187.7 |
| 10 | 90 | 10 | Si undetected | Si undetected | Si undetected | Si undetected | Si undetected |
| 11 | 95 | 5 | Si undetected | Si undetected | Si undetected | Si undetected | Si undetected |

TABLE 5

| | Volume ratio | | | PCBT |
|---|---|---|---|---|
| Sample | CU | Glass | Plating | (NG number) |
| 1 | 5 | 95 | ○ | 0/17 |
| 2 | 10 | 90 | ○ | 0/17 |
| 3 | 15 | 85 | ○ | 0/17 |
| 4 | 30 | 70 | ○ | 0/17 |
| 5 | 40 | 60 | ○ | 0/17 |
| 6 | 51 | 49 | ○ | 0/17 |
| 7 | 60 | 40 | ○ | 0/17 |
| 8 | 70 | 30 | ○ | 1/17 |
| 9 | 85 | 15 | ○ | 1/17 |
| 10 | 90 | 10 | ○ | 3/17 |
| 11 | 95 | 5 | ○ | 4/17 |

From the above results, in Comparative Example 1 in which only the external electrode (plating layer) was formed without the underlying layer, miniaturization of the entire electronic component could be achieved because there was no underlying layer; however, adhesion between the plating layer and the ceramic element assembly was not due to chemical bonding, and therefore, it was confirmed that both the close-contact properties and the sealing properties were insufficient. As in Comparative Example 2, when a thin underlying layer is to be formed with a glass paste, places where glass is present in a large amount in a glass paste film are increased, and plating is difficult to be formed in places where there is a large amount of glass. In order to uniformly form a plating layer as in Comparative Example 3, when a glass paste is applied thickly, it is difficult to reduce the thickness of an underlying layer. In the method using a glass paste containing a metal powder as in Comparative Examples 2 and 3, even when a powder having a small average grain size was used as a raw material, since particles were connected to each other during heat treatment, unlike the present invention, a granular metal material having a small average grain size could not be dispersed in a glass material.

In addition, it was confirmed that the dispersibility and the moisture resistance reliability were improved when the content of a metal material in an underlying layer was not more than 60% by volume.

In the ceramic electronic component of the present invention, since a total thickness of the underlying layer and the external electrode can be reduced, the size of the component can be reduced. In addition, the sealing properties and the plating resistance are high, and the reliability is high; therefore, the ceramic electronic component can be suitably used in various electronic devices.

DESCRIPTION OF REFERENCE SYMBOLS

1: Ceramic electronic component
2: Ceramic element assembly
4: Underlying layer
6: External electrode
8: Internal electrode
10: Ceramic layer

The invention claimed is:

1. A ceramic electronic component comprising:
a ceramic element assembly;
an underlying layer on the ceramic element assembly; and
an external electrode on the underlying layer, wherein
the underlying layer comprises a metal material and a glass material containing silicon atoms,
the metal material exists in a highly dispersed state in the glass material,
the metal material is granular in the underlying layer,
an average grain size of the metal material is not less than 2.0 nm and not more than 1.0 μm, and
an average inter-grain distance of the metal material is not less than 1.0 nm and not more than 1.0 μm.

2. The ceramic electronic component according to claim 1, wherein the metal material contains at least one of copper and silver.

3. The ceramic electronic component according to claim 1, wherein metal atoms of the metal material and the silicon atoms of the glass material coexist in a region of the underlying layer located at a center in a thickness direction of the underlying layer in a cross section in the thickness direction thereof, and
the region of the underlying layer has a depth of not less than 0.2 μm and not more than 2 μm from a surface of the cross section and a diameter of not less than 0.2 μm and not more than 2 μm.

4. The ceramic electronic component according to claim 3, wherein a ratio of a content of the metal atoms to a content of the silicon atoms in the region is not less than 1.0 and not more than 200 in mass ratio.

5. The ceramic electronic component according to claim 1, wherein a thickness of the underlying layer is not more than 10.0 μm.

6. The ceramic electronic component according to claim 1, wherein the underlying layer is obtained by applying a sol in which a silicon compound, a metal salt, and one of boric acid and boron alkoxide are dissolved or dispersed in a solvent, and then applying heat treatment to the sol.

7. The ceramic electronic component according to claim 6, wherein the heat treatment is performed under a reducing atmosphere.

* * * * *